CARRIER OPERATED SQUELCH CIRCUIT

Filed June 28, 1954

INVENTOR.
ROBERT G. WALKER
BY
Clark & Ott
ATTORNEYS

United States Patent Office 2,767,310

Patented Oct. 16, 1956

2,767,310

CARRIER OPERATED SQUELCH CIRCUIT

Robert G. Walker, Orange, N. J., assignor to Air Associates, Incorporated, Teterboro, N. J., a corporation of New Jersey Application June 28, 1954, Serial No. 439,697

5 Claims. (Cl. 250—20)

This invention relates to a carrier operated squelch circuit for eliminating the transmission of signals to a load circuit when the carrier level falls below a predetermined level. The invention has particular reference to a circuit used in conjunction with radio receiving sets but is not limited to this application.

Many squelch circuits have been designed and used in order to eliminate the noise which is generally present when the carrier wave has been reduced to a very low value. This condition is generally present when the tuning of a receiving circuit is altered so as to eliminate one radio wave and receive another at a different frequency. Prior art squelch circuits have generally operated in a gradual manner, the amount of squelch being proportional to the strength of the carrier wave. The present invention applies the squelch characteristic only after the carrier wave has dropped to a predetermined level and at that value the load circuit is entirely cut off from the receiving set. When the tuning progresses so as to raise the carrier level again above a predetermined level the load circuit is again fully connected and receives the entire output of the tuning circuit.

One of the objects of this invention is to provide an improved squelch circuit which avoids one or more of the disadvantages and limitations of prior art arrangements.

Another object of the invention is to provide a squelch circuit which is positive in action and changes abruptly from the condition of full transmission to zero transmission at a predetermined carrier level.

Another object of the invention is to provide a squelch circuit which generates no noise of its own.

Another object of the invention is to provide a squelch circuit which can be operated with any type of receiving circuit using a carrier wave.

Another object of the invention is to provide a squelch circuit which operates directly from an automatic volume control (A. V. C.) line.

Another object of the invention is to increase the speed of reaction of squelch circuits, dependent only upon the ionization time of the gas in a gas diode.

The squelch circuit includes a gas diode which is made conductive when the carrier signal drops below a predetermined level. If the automatic volume control circuit is used an amplifier tube is employed as a coupling means between this circuit and the gas diode. The current through the gas diode controls a second amplifier stage which in turn controls the relative potentials of the cathode and anode in a vacuum diode which is connected in series with the load circuit.

For a better understanding of the present invention, together with other and further objects thereof, reference is made to the following description taken in connection with the accompanying drawings.

Figure 1:
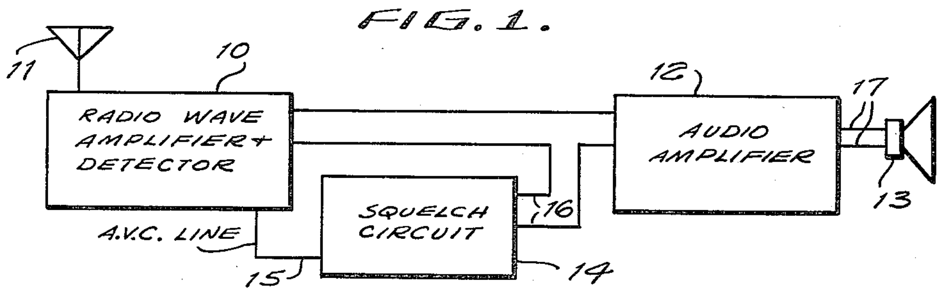
Fig. 1 is a schematic diagram of connections in block form showing the application of the squelch circuit between the radio wave amplifier and the audio amplifier of a radio receiving set.

Referring now to Fig. 1, a radio wave tuning circuit 10 is shown connected to an antenna 11 and sending its output to an audio amplifier 12 and a load circuit 13 which may be a loud speaker. The output circuit is connected in series with a squelch circuit 14 and the automatic volume control line 15 is connected to the squelch circuit 14 for controlling its operation. The circuit shown in Fig. 1 is capable of many variations. The radio wave amplifier 10 may be designed for accepting and amplifying amplitude modulated waves or frequency modulated waves or any type of modulation which uses a carrier signal. Also it is not necessary to employ the automatic volume control line as a controlling means for the squelch circuit but any signal which varies in conformity with the strength of the carrier signal may be used for this purpose. In Fig. 1 the squelch circuit is shown with its output conductors 16 in series with the input circuit of the audio amplifier 12. Conductors 16 may be in series with any part of the audio amplifier circuit including its output conductors 17, the only requirement being that an infinite impedance between conductors 16 causes the interruption of the audio signals.

Figure 2:
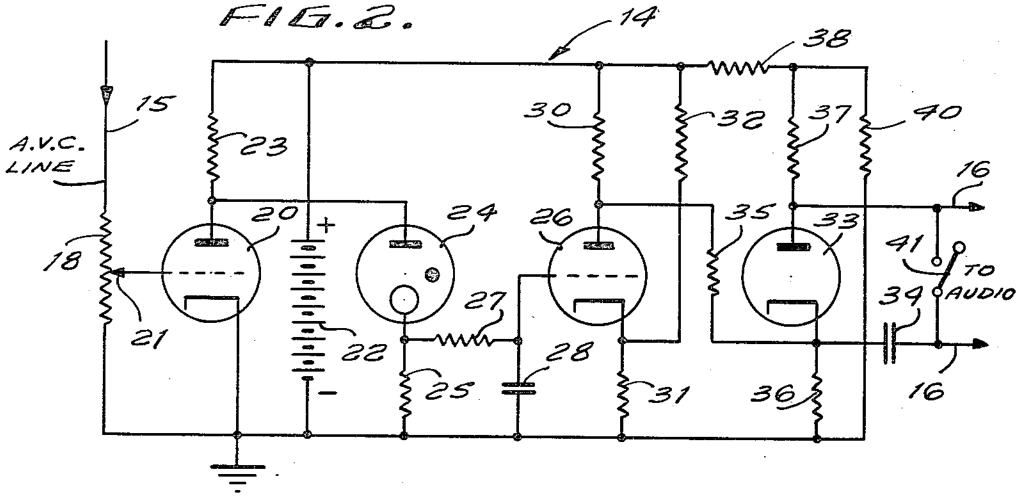
Fig. 2 is a schematic diagram of connections showing the squelch circuit in detail.

The circuit shown in Fig. 2 employs the A. V. C. line 15 as a control means, this circuit being connected in series with a voltage divider 18 and a ground connection. An amplifier tube 20 which may be a triode has its control electrode connected to an adjustable connection 21 on voltage divider 18, the adjustment of this contact determining the operating voltage of the squelch circuit. Amplifier tube 20 receives its anode current from a source of potential 22 in series with an anode resistor 23, its cathode being grounded. Coupled to tube 20 is a gas diode 24 having its anode connected directly to the anode of tube 20 and its cathode connected in series with a resistor 25 to ground. The gas diode 24 is coupled to a second amplifier tube 26 by means of a coupling circuit which includes a resistor 27 connected between the cathode of diode 24 and the control electrode of amplifier 26. A capacitor 28 is connected between the control electrode and ground to eliminate any high frequencies which may have been picked up by the circuit. Amplifier tube 26 receives its anode current from the source of potential 22 in series with an anode resistor 30. The cathode of tube 26 is connected to ground in series with resistor 31. In order to more definitely establish the potential of the cathode, resistor 32 is connected between the cathode and the positive terminal of the source of potential, resistors 32 and 31 thereby forming a voltage divider.

The output stage of the squelch circuit 14 includes a vacuum diode 33 having its anode and cathode connected in series with conductors 16 and a blocking capacitor 34. Diode 33 is coupled to amplifier 26 by means of a resistor 35 which is connected between the anode of tube 26 and the cathode of diode 33. The cathode of diode 33 is connected in series with a resistor 37 to the junction point of resistors 38 and 40 which together form a voltage divider connected to the terminals of the source of potential 22. A manually operated switch 41 is provided so that conductors 16 may be connected together and the squelch circuit effectively eliminated.

The operation of this circuit is as follows: let it be assumed that the normal carrier voltage is present in the radio wave amplifier 10 and the A. V. C. current is at its maximum value. The A. V. C. line 15 is negative with respect to ground and the control electrode of tube 20 is therefore made considerably more negative than the cathode, and the tube is made non-conductive. This action applies full voltage on the anode of the gas diode 24 and the diode is fired, causing a current to flow from the positive terminal of the source of potential 22, through resistor 23, through the diode 24, through resistor 25, to ground, thereby raising the potential of the cathode and also raising the potential of the control electrode of amplifier tube 26 causing that tube to conduct. When tube 26 is made conductive it draws current through resistor 30 and thereby lowers the potential of the cathode of diode 33 causing its anode to be more positive than the cathode and permitting conduction through the tube and effectively connecting conductors 16 in series with a low impedance. It is well known that a gas diode generates a small amount of noise when conducting and to eliminate this resistor 27 and capacitor 28 are included in the circuit as a filtering arrangement so that only a direct current potential will be applied to the control electrode of amplifier tube 26.

Let it now be assumed that the carrier level is reduced and the A. V. C. line carries a small amount of current which is less than the predetermined value. The reduced current raises the potential of the control electrode in tube 20 making it less negative and going beyond the cut-off value thereby causing tube 20 to become conductive. The current for tube 20 passes through resistor 23 and causes an additional voltage drop which lowers the potential across diode 24 to a value which is less than the ignition value and diode 24 is extinguished. The absence of current through the diode and resistor 25 places the control electrode of amplifier tube 26 at about ground potential and since the cathode of tube 26 is held at a positive potential, due to resistors 31 and 32, the tube is rendered non-conductive and the anode current through resistor 30 is reduced to zero. When the voltage drop across resistor 30 is reduced the potential of the cathode of tube 33 is raised to a voltage which is greater than its anode, and diode 33 is thereby rendered non-conductive and the conductors 16—16 are isolated from each other eliminating the input signals to the audio amplifier 12 and effectively squelching the circuit and eliminating the transfer of signals between circuits 10 and 12.

It will be obvious from the above description that the setting of contact point 21 determines the value of the carrier wave which will fire the gas diode 24 and render the diode 33 conducting. It will also be evident that the proper selection of resistors 31 and 32 are necessary for the operation of amplifier tube 26 and the voltage divider consisting of resistors 30, 35, and 36 must be properly adjusted to control the cathode potential in vacuum diode 33. It should also be noted that the squelch circuit when operated produces a complete and positive elimination of transmitted signals because a vacuum diode whose cathode has a higher potential than its anode represents an infinite impedance and a positive cut-off.

Figure 3:
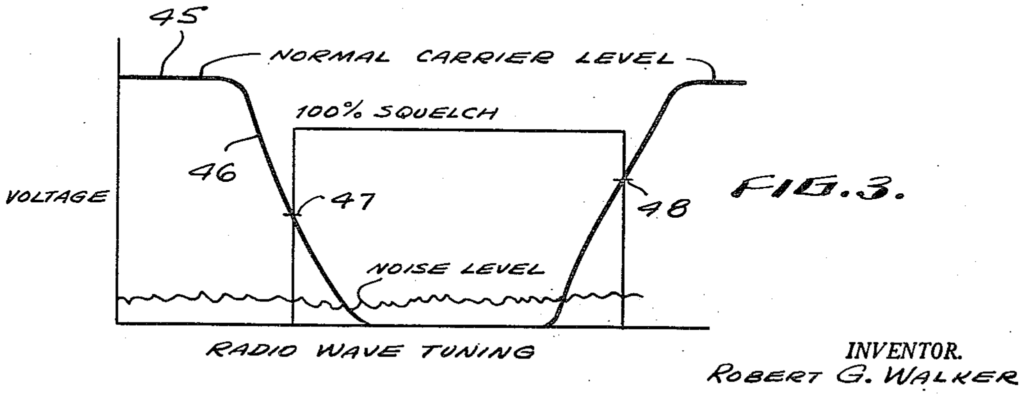
Fig. 3 is a graph showing the operation of the squelch circuit when the tuning of a radio receiving set is changed from one frequency to another.

The graph in Fig. 3 has been added to explain and illustrate the abrupt action of the squelch circuit. When one radio wave is tuned by the receiving set 10 its automatic volume control circuit maintains the carrier level at a constant value as illustrated by the flat portion of curve 45. If the set is now detuned, as will be done when passing from the tuning point of one transmitting frequency to another, the carrier level is lowered as illustrated by curve 46 until a point 47 is reached which is the current value which causes tube 20 to conduct and render the diode 24 non-conductive. When this happens the conductivity of diode 33 is abruptly changed from a conductive condition to a non-conductive condition and a squelch circuit entirely cuts off the audio input signal. As the set is further detuned it will pass through a condition of practically no carrier signal at all at which point the noise level would cause considerable disturbance in the audio amplifier. However, with the squelch circuit in operation the noise is eliminated. As the change in tuning is continued and another carrier wave picked up a point 48 is reached where the tube 20 is made non-conductive and diode 24 is made conductive thereby connecting the audio amplifier input through diode 33 as previously described.

While there have been described and illustrated specific embodiments of the invention, it will be obvious that various changes and modifications may be made therein without departing from the field of the invention which should be limited only by the scope of the appended claims.

What is claimed is:

1. In a receiver of radiant energy signals having a modulated carrier wave; a squelch circuit for eliminating the transmission of signals when the amplitude of the carrier wave is reduced below a predetermined minimum value comprising; a gas-filled diode coupled to a detector circuit which is responsive to the amplitude of the rectified carrier wave, circuit control means which renders the gas-filled diode conductive or nonconductive in response to the variations in amplitude of the carrier wave, a vacuum diode coupled to the gas-filled diode and arranged to conduct when the carrier wave is above the predetermined minimum value and to be nonconductive when the carrier wave is below the minimum value, and circuit means connecting the vacuum diode in series with a signal translating circuit in a portion of the receiver.

2. In a receiver of radiant energy signals having a modulated carrier wave; a squelch circuit for eliminating the transmission of signals when the amplitude of the carrier wave is reduced below a predetermined minimum value comprising; an amplifier coupling stage connected between a conductor carrying a rectified portion of said carrier wave and a gas-filled diode, circuit control means which renders the gas-filled diode conductive or nonconductive in response to the variations in amplitude of the carrier wave, a vacuum diode coupled to the gas-filled diode and arranged to conduct when the carrier wave is above the predetermined minimum and to be nonconductive when the carrier wave is below the minimum value, and circuit means connecting the vacuum diode in series with a signal translating circuit in a portion of the receiver.

3. In a receiver of radiant energy signals having a modulated carrier wave; a squelch circuit for eliminating the transmission of signals when the amplitude of the carrier wave is reduced below a predetermined minimum value comprising, an amplifier coupling stage connected between a conductor carrying a rectified portion of said carrier wave and a gas-filled diode, circuit control means which renders the gas-filled diode conductive or nonconductive in response to variations in the amplitude of the carrier wave, a vacuum diode coupled to the gas-filled diode by means of an amplifier stage and controlled by said stage to conduct when the carrier wave is above said minimum value and to be nonconductive when the carrier wave is below the minimum value, and circuit means connecting the vacuum diode in series with a signal translating circuit in a portion of the receiver.

4. In a receiver of radiant energy signals having a modulated carrier wave; a squelch circuit for eliminating the transmission of signals when the amplitude of the carrier wave is reduced below a predetermined minimum value comprising, an amplifier coupling stage connected between a conductor carrying a rectified portion of said carrier wave and a gas-filled diode, circuit control means which renders the gas-filled diode conductive or nonconductive in response to variations in the amplitude of the carrier wave, said coupling stage connected to the conductor by an adjustable voltage divider by which said predetermined minimum value may be manually changed, a vacuum diode coupled to the gas-filled diode by means of an amplifier stage and controlled by said stage to conduct when the carrier wave is above said minimum value and to be nonconductive when the carrier wave is below the minimum value, and circuit means connecting the vacuum diode in series with a signal translating circuit in a portion of the receiver.

5. In a receiver of radiant energy signals having a modulated carrier wave; a squelch circuit for eliminating the transmission of signals when the amplitude of the carrier wave is reduced below a predetermined minimum value comprising; a rectifier circuit which rectifies a portion of the carrier wave and removes the radio frequencies therefrom, a gas-filled diode coupled to said rectifier circuit which is responsive to the amplitude of the carrier wave, circuit control means which renders the gas-filled diode conductive or nonconductive in response to the variations in amplitude of the carrier wave, a vacuum diode coupled to the gas-filled diode and arranged to conduct when the carrier wave is above the said minimum value and to be nonconductive when the carrier wave is below the minimum value, and circuit means connecting the vacuum diode in series with a signal translating circuit in a portion of the receiver.

References Cited in the file of this patent

UNITED STATES PATENTS 2,248,267 Bacon ------------------ July 8, 1941

FOREIGN PATENTS 624,522 Great Britain ---------- June 10, 1949